(12) United States Patent
Tarlow et al.

(10) Patent No.: US 10,393,824 B2
(45) Date of Patent: Aug. 27, 2019

(54) TECHNIQUES FOR MAGNETOMETER CALIBRATION USING SELECTED MEASUREMENTS OVER TIME

(71) Applicant: QUALCOMM Incorporated, San Diego, CA (US)

(72) Inventors: Benjamin Tarlow, Cambridge (GB); Murray Jarvis, Cambridge (GB); William Morrison, San Francisco, CA (US)

(73) Assignee: QUALCOMM Incorporated, San Diego, CA (US)

( * ) Notice: Subject to any disclaimer, the term of this patent is extended or adjusted under 35 U.S.C. 154(b) by 363 days.

(21) Appl. No.: 15/389,613

(22) Filed: Dec. 23, 2016

(65) Prior Publication Data

US 2018/0180683 A1 Jun. 28, 2018

(51) Int. Cl.
*G01R 33/00* (2006.01)
*G01R 33/02* (2006.01)

(52) U.S. Cl.
CPC ......... *G01R 33/0035* (2013.01); *G01R 33/02* (2013.01)

(58) Field of Classification Search
CPC ............ G01R 33/0017; G01R 33/0035; G01R 33/0206; G01R 33/028; G01R 33/038; G01R 33/1215; B64G 1/366
USPC .................................................. 324/202, 244
See application file for complete search history.

(56) References Cited

U.S. PATENT DOCUMENTS

| | | | | |
|---|---|---|---|---|
| 5,274,328 A * | 12/1993 | Begin | .................... | G01B 7/02 324/202 |
| 7,451,549 B1 | 11/2008 | Sodhi et al. | | |
| 8,781,739 B1 * | 7/2014 | Miller | .................... | G01S 5/0252 324/202 |
| 2011/0106477 A1 * | 5/2011 | Brunner | ............. | G01R 33/0035 702/104 |
| 2013/0218505 A1 | 8/2013 | Bhandari et al. | | |
| 2013/0245984 A1 * | 9/2013 | Sheng | ................ | G01R 33/0035 702/94 |
| 2013/0320966 A1 * | 12/2013 | Oliver | ................ | G01R 33/0035 324/202 |
| 2015/0019159 A1 * | 1/2015 | Elgersma | ............. | G01R 35/005 702/150 |

(Continued)

OTHER PUBLICATIONS

Renaudin V., et al., "New Method for Magnetometers Based Orientation Estimation", IEEE/ION Position Location and Navigation (PLAN), Palm Springs, CA, May 4-6, 2010, pp. 1-9.

*Primary Examiner* — Tung X Nguyen
*Assistant Examiner* — Robert P Alejnikov, Jr.
(74) *Attorney, Agent, or Firm* — Harrity & Harrity, LLP

(57) ABSTRACT

Certain aspects of the present disclosure generally relate to magnetometer calibration. In some aspects, a device may obtain multiple sets of magnetic field measurements corresponding to multiple local magnetic field strengths, wherein each set of magnetic field measurements is measured in association with an unknown local magnetic field strength. The device may calculate multiple error values using the multiple sets of magnetic field measurements, estimated values of the multiple local magnetic field strengths, and estimated hard iron bias values. The device may identify a set of hard iron bias values for magnetometer calibration based at least in part on comparing the multiple error values. The device may calibrate a magnetometer using the identified set of hard iron bias values.

30 Claims, 6 Drawing Sheets

(56) References Cited

U.S. PATENT DOCUMENTS

2015/0177020 A1 6/2015 An et al.
2015/0354980 A1 12/2015 Wahdan et al.
2016/0202359 A1* 7/2016 Kana .................. G01C 21/08
                                                701/468

* cited by examiner

TECHNIQUES FOR MAGNETOMETER CALIBRATION USING SELECTED MEASUREMENTS OVER TIME

FIELD OF THE DISCLOSURE

Aspects of the present disclosure generally relate to techniques for determining magnetometer calibration, and more particularly to techniques for magnetometer calibration using selected measurements over time.

BACKGROUND

A magnetometer may refer to a device that measures magnetism, such as the strength and/or direction of a magnetic field at a point in space. A magnetometer may be incorporated into an integrated circuit and may be used in a mobile device as, for example, a compass used for navigation.

SUMMARY

In some aspects, a method may include obtaining, by a device, multiple sets of magnetic field measurements corresponding to multiple local magnetic field strengths, wherein each set of magnetic field measurements is measured in association with an unknown local magnetic field strength. The method may include calculating, by the device, multiple error values using the multiple sets of magnetic field measurements, estimated values of the multiple local magnetic field strengths, and estimated hard iron bias values. The method may include identifying, by the device, a set of hard iron bias values for magnetometer calibration based at least in part on comparing the multiple error values. The method may include calibrating, by the device, a magnetometer using the identified set of hard iron bias values In some aspects, a device may include one or more processors to obtain multiple sets of magnetic field measurements corresponding to multiple local magnetic field strengths, wherein each set of magnetic field measurements is measured in association with an unknown local magnetic field strength. The one or more processors may calculate multiple error values using the multiple sets of magnetic field measurements, estimated values of the multiple local magnetic field strengths, and estimated hard iron bias values. The one or more processors may identify a set of hard iron bias values for magnetometer calibration based at least in part on comparing the multiple error values. The one or more processors may calibrate a magnetometer using the identified set of hard iron bias values.

In some aspects, a non-transitory computer-readable medium may store one or more instructions that, when executed by one or more processors of a device, cause the one or more processors to obtain multiple sets of magnetic field measurements corresponding to multiple local magnetic field strengths, wherein each set of magnetic field measurements is measured in association with an unknown local magnetic field strength. The one or more instructions may cause the one or more processors to calculate multiple error values using the multiple sets of magnetic field measurements, estimated values of the multiple local magnetic field strengths, and estimated hard iron bias values. The one or more instructions may cause the one or more processors to identify a set of hard iron bias values for magnetometer calibration based at least in part on comparing the multiple error values. The one or more instructions may cause the one or more processors to calibrate a magnetometer using the identified set of hard iron bias values.

In some aspects, an apparatus may include means for obtaining multiple sets of magnetic field measurements corresponding to multiple local magnetic field strengths, wherein each set of magnetic field measurements is measured in association with an unknown local magnetic field strength. The apparatus may include means for calculating multiple error values using the multiple sets of magnetic field measurements, estimated values of the multiple local magnetic field strengths, and estimated hard iron bias values. The apparatus may include means for identifying a set of hard iron bias values for magnetometer calibration based at least in part on comparing the multiple error values. The apparatus may include means for calibrating a magnetometer using the identified set of hard iron bias values.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

The detailed description set forth below, in connection with the appended drawings, is intended as a description of various configurations and is not intended to represent the only configurations in which the concepts described herein may be practiced. The detailed description includes specific details for providing a thorough understanding of the various concepts. However, it will be apparent to those skilled in the art that these concepts may be practiced without these specific details.

Many devices, such as mobile devices (e.g., smart phones, tablet computers, wearable devices, etc.), may include a magnetometer to measure the strength and/or direction of a magnetic field for various applications, such as navigation. A magnetometer may need to be recalibrated over time, such as by calibrating the magnetometer to compensate for hard iron bias (e.g., also known as hard iron error or hard iron distortion) and/or soft iron bias (e.g., also known as soft iron error or soft iron distortion). Hard iron bias may refer to a distortion in a magnetometer measurement due to an object that produces a magnetic field, such as a magnet of a speaker included in the mobile device. Soft iron bias may refer to a distortion in a magnetometer measurement due to a deflection or alteration of an existing magnetic field. In a mobile device, hard iron bias often leads to a larger error than soft iron bias.

A magnetometer of a mobile device may be calibrated by taking magnetic field measurements when the mobile device and magnetometer are moving through space according to a particular pattern, such as a figure eight. For example, a user may be prompted to move the mobile device through space according to a pattern, and the magnetometer may be calibrated to compensate for hard iron bias and/or soft iron bias using measurements taken while the mobile device is moving according to the pattern. However, this is inconvenient for the user, particularly when the magnetometer is frequently recalibrated. Furthermore, such calibration may be inaccurate if the user does not strictly adhere to the pattern. Aspects described herein permit magnetometer calibration using selected measurements over time due to the natural movement of the mobile device (e.g., in association with movement of the user), which may improve a user experience and an accuracy of the calibration.

Figure 1:
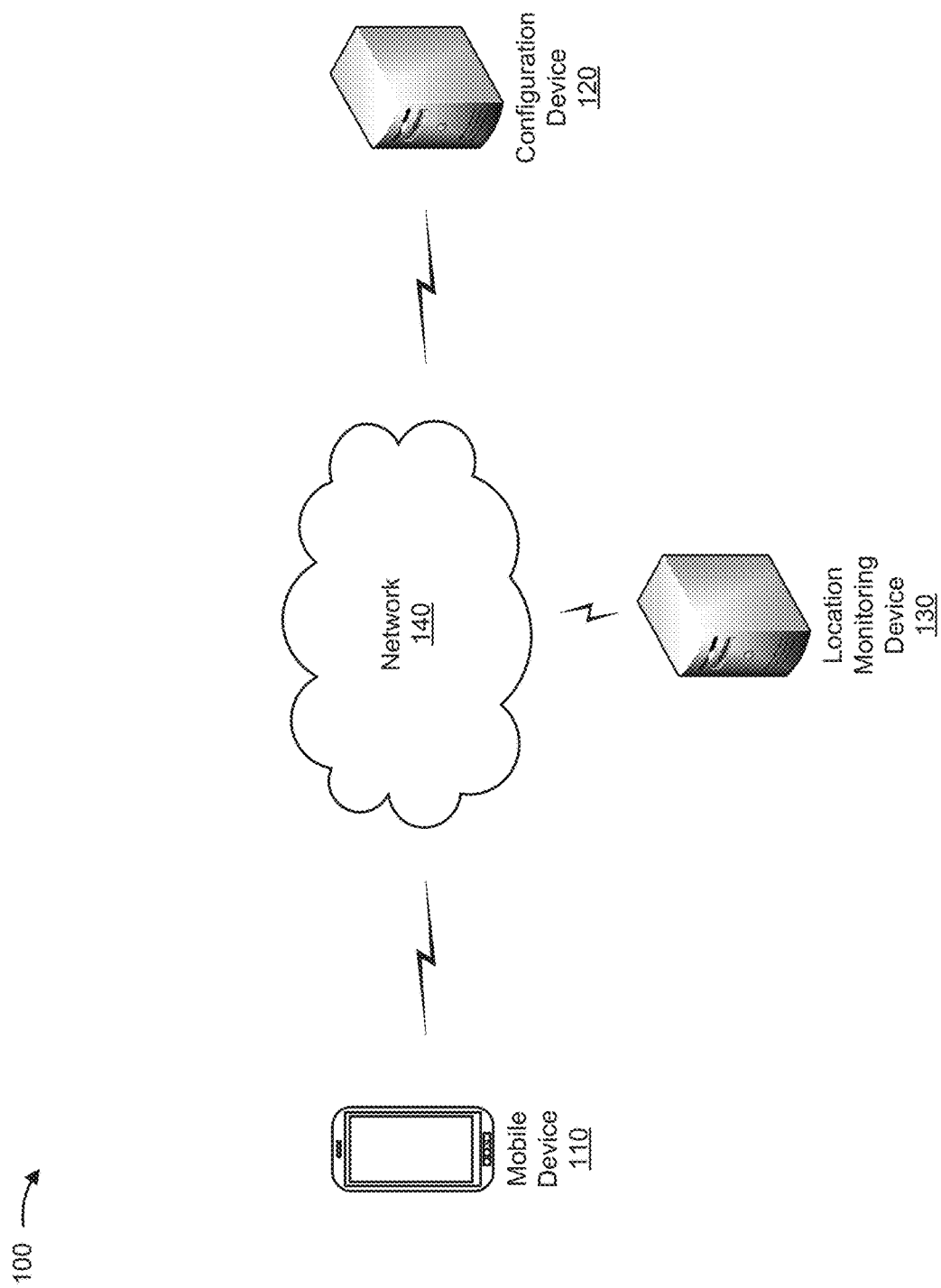
FIG. 1 is a diagram illustrating an example environment in which techniques described herein may be implemented, in accordance with various aspects of the present disclosure.

FIG. 1 is a diagram illustrating an example environment 100 in which techniques described herein may be implemented, in accordance with various aspects of the present disclosure. As shown in FIG. 1, environment 100 may include a mobile device 110, a configuration device 120, a location monitoring device 130, and/or a network 140. Devices of environment 100 may interconnect via wired connections, wireless connections, or a combination of wired and wireless connections.

Mobile device 110 includes one or more devices that include a magnetometer. For example, mobile device 110 may include a portable electronic device, such as a wireless communication device (e.g., a user equipment, a mobile phone, a smart phone, etc.), a laptop computer, a tablet computer, a portable gaming device, a wearable communication device (e.g., a smart wristwatch, a pair of smart eyeglasses, a smart band, smart clothing, etc.), or a similar type of device. In some aspects, mobile device 110 may communicate with configuration device 120, such as to receive configuration information associated with calibrating a magnetometer of mobile device 110.

Configuration device 120 includes one or more devices capable of receiving, generating, storing, processing, and/or providing configuration information associated with magnetometer calibration. For example, configuration device 120 may include a communication and/or computing device, such as a server, a desktop computer, a laptop computer, a tablet computer, a wireless communication device, or a similar type of device. In some aspects, configuration device 120 may receive input associated with configuring a manner in which mobile device 110 is to calibrate a magnetometer, and may provide output and/or instructions to mobile device 110 110 to configure mobile device 110 using configuration information based at least in part on the input. For example, the configuration information may include information identifying one or more conditions associated with calibration, information identifying a manner in which one or more values are to be constrained, information relating to excluding of assigning weights to measurements, information regarding one or more thresholds, and/or the like, as described in more detail elsewhere herein.

Location monitoring device 130 includes one or more devices associated with receiving, generating, storing, processing, and/or providing information that identifies a location of mobile device 110. For example, location monitoring device 130 may include a server or a similar type of device. In some aspects, location monitoring device 130 may include and/or may communicate with a satellite (e.g., a global positioning system (GPS) satellite), a base station, and/or the like. For example, location monitoring device 130 may determine a location of mobile device 110 using GPS data, triangulation data, multi-lateration data, and/or the like. Additionally, or alternatively, mobile device 110 may determine a location of mobile device 110 without communicating with location monitoring device 130. The location of mobile device 110 may be used in association with calibrating a magnetometer of mobile device 110, as described in more detail elsewhere herein.

Network 140 includes one or more wired and/or wireless networks. For example, network 140 may include a cellular network (e.g., a 5G network, a 4G or long-term evolution (LTE) network, a third generation (3G) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. In some aspects, when two or more devices shown in FIG. 1 are implemented within a single device, the two or more devices may communicate via a bus. Additionally, or alternatively, a set of devices (e.g., one or more devices) of environment 100 may perform one or more functions described as being performed by another set of devices of environment 100.

Figure 2:
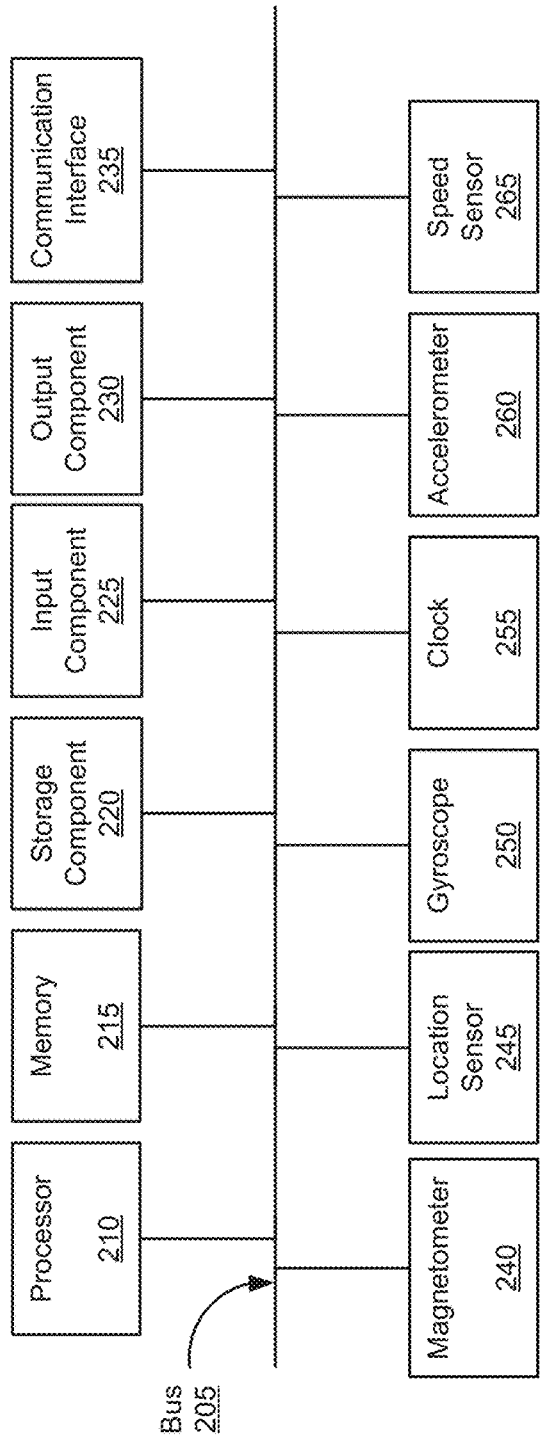
FIG. 2 is a diagram illustrating example components of one or more devices shown in FIG. 1, such as a mobile device, in accordance with various aspects of the present disclosure.

FIG. 2 is a diagram of example components of a device 200. Device 200 may correspond to mobile device 110, in some aspects. Additionally, or alternatively, mobile device 110, configuration device 120, and/or location monitoring device 130 may include one or more devices 200 and/or one or more components of device 200. As shown in FIG. 2, device 200 may include a bus 205, a processor 210, a memory 215, a storage component 220, an input component 225, an output component 230, a communication interface 235, a magnetometer 240, a location sensor 245, a gyroscope 250, a clock 255, an accelerometer 260, and/or a speed sensor 265.

Bus 205 includes a component that permits communication among the components of device 200. Processor 210 includes a central processing unit (CPU), a graphics processing unit (GPU), an accelerated processing unit (APU), a digital signal processor (DSP), a microprocessor, a microcontroller, a field-programmable gate array (FPGA), an application-specific integrated circuit (ASIC), and/or another type of processing component. Processor 210 is implemented in hardware, firmware, or a combination of hardware and software. In some aspects, processor 210 includes one or more processors capable of being programmed to perform a function.

Memory 215 includes a random access memory (RAM), a read only memory (ROM), and/or another type of dynamic or static storage device (e.g., a flash memory, a magnetic memory, and/or an optical memory) that stores information and/or instructions for use by processor 210.

Storage component 220 stores information and/or software related to the operation and use of device 200. For example, storage component 220 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 225 includes a component that permits device 200 to receive information, such as via user input (e.g., a touch screen display, a keyboard, a keypad, a mouse, a button, a switch, and/or a microphone). Additionally, or alternatively, input component 225 may include a sensor for sensing information (e.g., an image sensor, a GPS component, an accelerometer, a gyroscope, and/or an actuator). Output component 230 includes a component that provides output from device 200 (e.g., a display, a speaker, and/or one or more light-emitting diodes (LEDs)).

Communication interface 235 includes a transceiver and/or a separate receiver and transmitter that enables device 200 to communicate with other devices, such as via a wired connection, a wireless connection, or a combination of wired and wireless connections. Communication interface 235 may permit device 200 to receive information from another device and/or provide information to another device. For example, communication interface 235 may include an Ethernet interface, an optical interface, a coaxial interface, an infrared interface, a radio frequency (RF) interface, a universal serial bus (USB) interface, a Wi-Fi interface, a cellular network interface, a wireless modem, an inter-integrated circuit (I²C), a serial peripheral interface (SPI), or the like.

Magnetometer 240 includes one or more magnetic sensors capable of measuring a strength and/or a direction of a local magnetic field. For example, magnetometer 240 may include a Hall effect sensor, an anisotropic magnetoresistive (AMR) sensor, a giant magneto-resistive sensor (GMR), and/or the like. In some aspects, magnetometer 240 may be incorporated into an integrated circuit used for navigation or another application.

Location sensor 245 includes one or more devices associated with determining a location of mobile device 110. For example, location sensor 245 may include a GPS receiver, a local positioning system (LPS) device (e.g., that uses triangulation, multi-lateration, etc.), and/or a similar type of device. The location of mobile device 110 may be used in association with calibrating a magnetometer of mobile device 110 (e.g., to determine whether a distance condition is satisfied, to determine whether mobile device 110 is located in a benign magnetic environment, etc.), as described in more detail elsewhere herein.

Gyroscope 250 includes one or more devices for measuring orientation. For example, gyroscope 250 may include a micro-electro-mechanical systems (MEMS) gyroscope or a similar type of device. Gyroscope 250 may be used to measure an orientation of mobile device 110, which may be used to assist with calibration of magnetometer 240 (e.g., to determine whether a geometric diversity condition is satisfied), as described in more detail elsewhere herein.

Clock 255 includes one or more devices that keep track of time (e.g., absolute time and/or relative time). For example, clock 255 may include a real-time clock, a computer clock, an integrated circuit clock, and/or the like. Clock 255 may be used to measure time, which may be used to assist with calibration of magnetometer 240 (e.g., to determine whether a time condition is satisfied, to determine whether a speed condition is satisfied, etc.), as described in more detail elsewhere herein.

Accelerometer 260 includes one or more devices capable of measuring acceleration of mobile device 110. In some aspects, accelerometer 260 may be used to measure a movement of mobile device 110. In some aspects, accelerometer 260 may be used to determine whether mobile device 110 is in motion or at rest, to measure a speed or acceleration of the motion of mobile device 110, and/or to measure an orientation of mobile device 110. This information may be used to assist with calibration of magnetometer 240 (e.g., to determine whether a geometric diversity condition is satisfied, to determine whether a speed condition is satisfied, etc.), as described in more detail elsewhere herein.

Speed sensor 265 includes one or more devices capable of measuring a speed of mobile device 110. This information may be used to assist with calibration of magnetometer 240 (e.g., to determine whether a speed condition is satisfied), as described in more detail elsewhere herein.

Device 200 may perform one or more processes described herein. Device 200 may perform these processes in response to processor 210 executing software instructions stored by a non-transitory computer-readable medium, such as memory 215 and/or storage component 220. A computer-readable medium is defined herein as a non-transitory memory device. A memory device includes memory space within a single physical storage device or memory space spread across multiple physical storage devices.

Software instructions may be read into memory 215 and/or storage component 220 from another computer-readable medium or from another device via communication interface 235. When executed, software instructions stored in memory 215 and/or storage component 220 may cause processor 210 to perform one or more processes described herein. Additionally, or alternatively, hardwired circuitry may be used in place of or in combination with software instructions to perform one or more processes described herein. Thus, aspects described herein are not limited to any specific combination of hardware circuitry and software.

Figure 3:
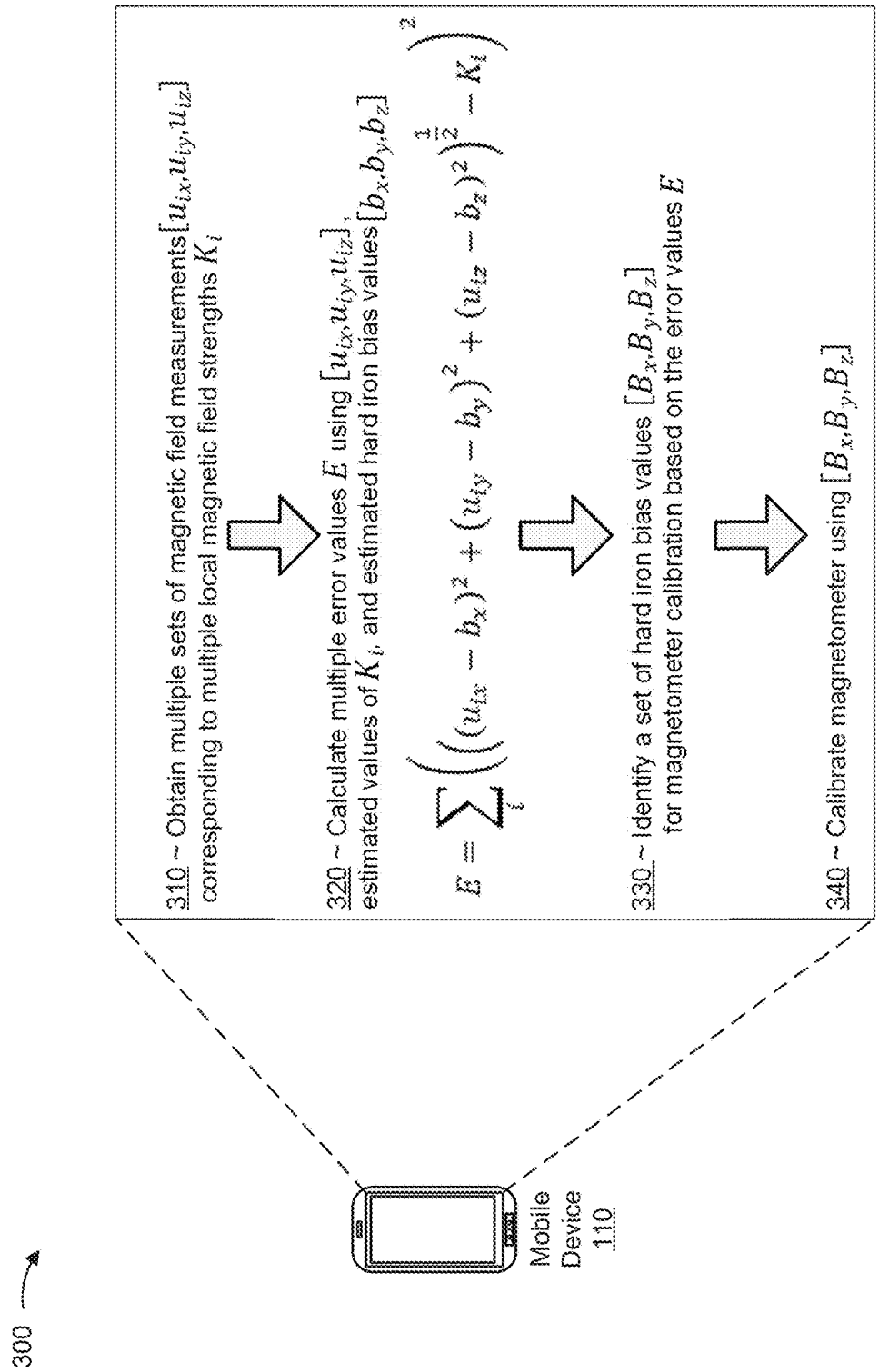
FIG. 3 is a diagram illustrating an example of magnetometer calibration using selected measurements over time, in accordance with various aspects of the present disclosure.
Figure 4:
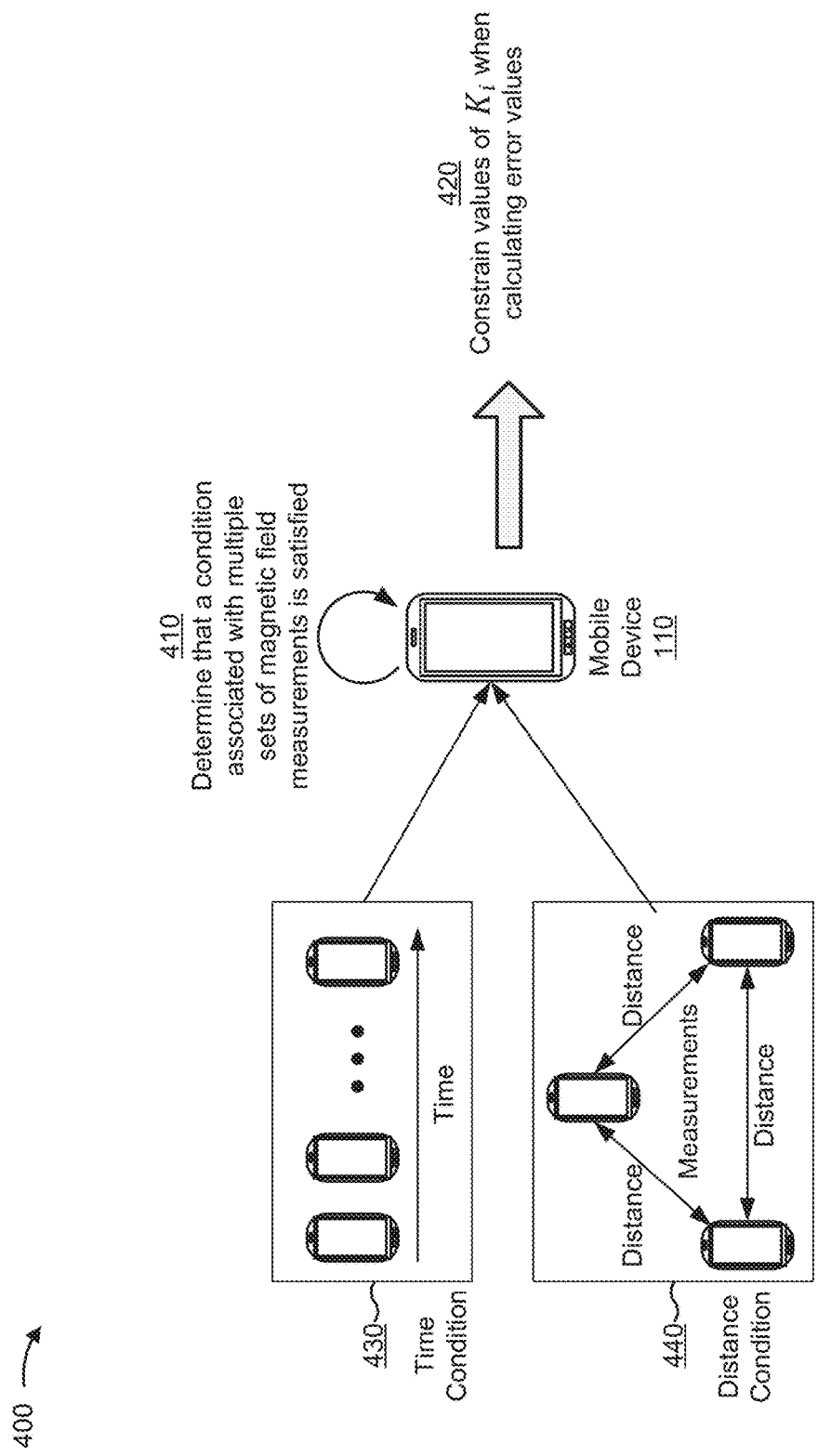
FIG. 4 is a diagram illustrating another example of magnetometer calibration using selected measurements over time, in accordance with various aspects of the present disclosure.
Figure 5:
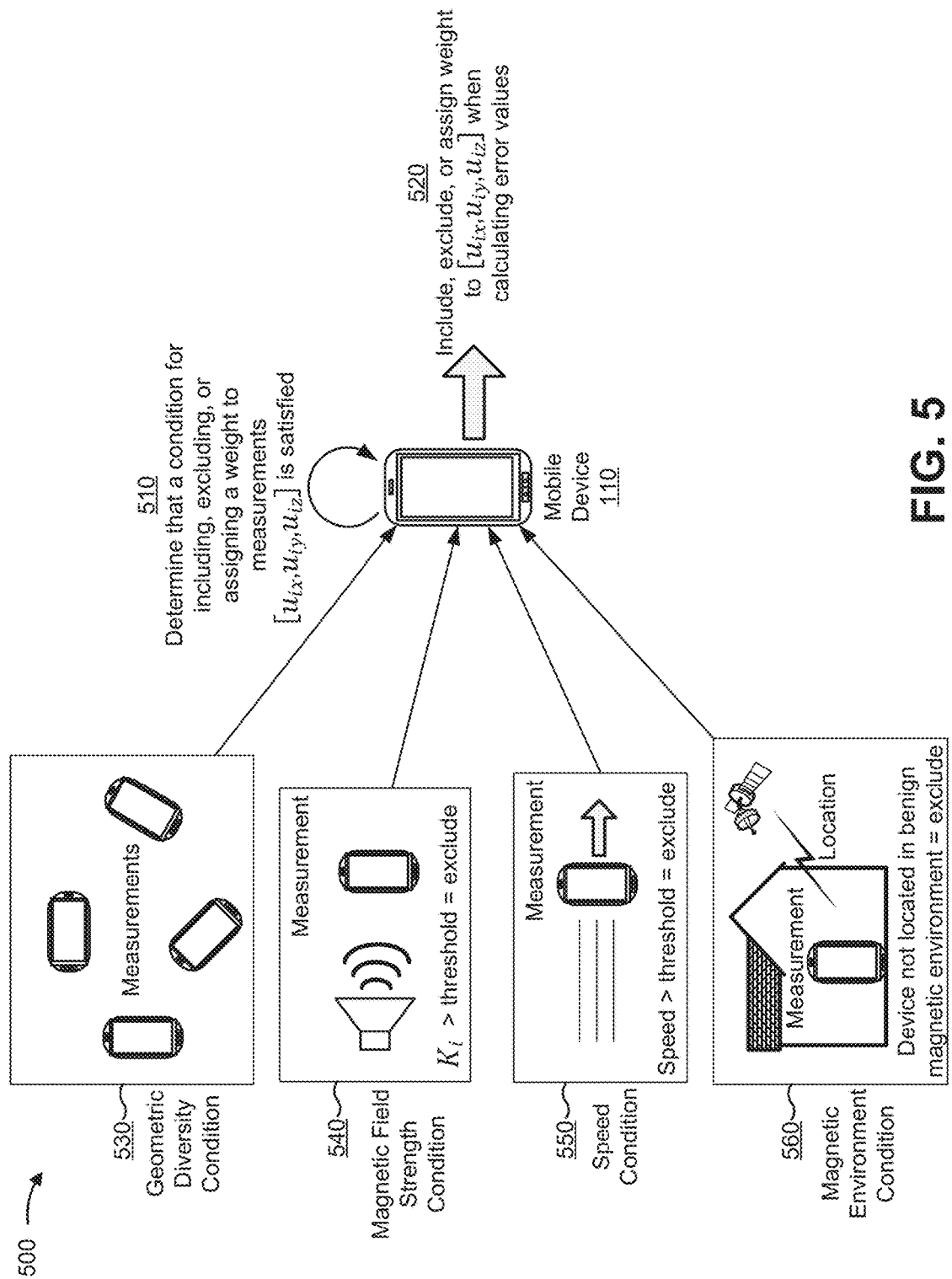
FIG. 5 is a diagram illustrating another example magnetometer calibration using selected measurements over time, in accordance with various aspects of the present disclosure.
Figure 6:
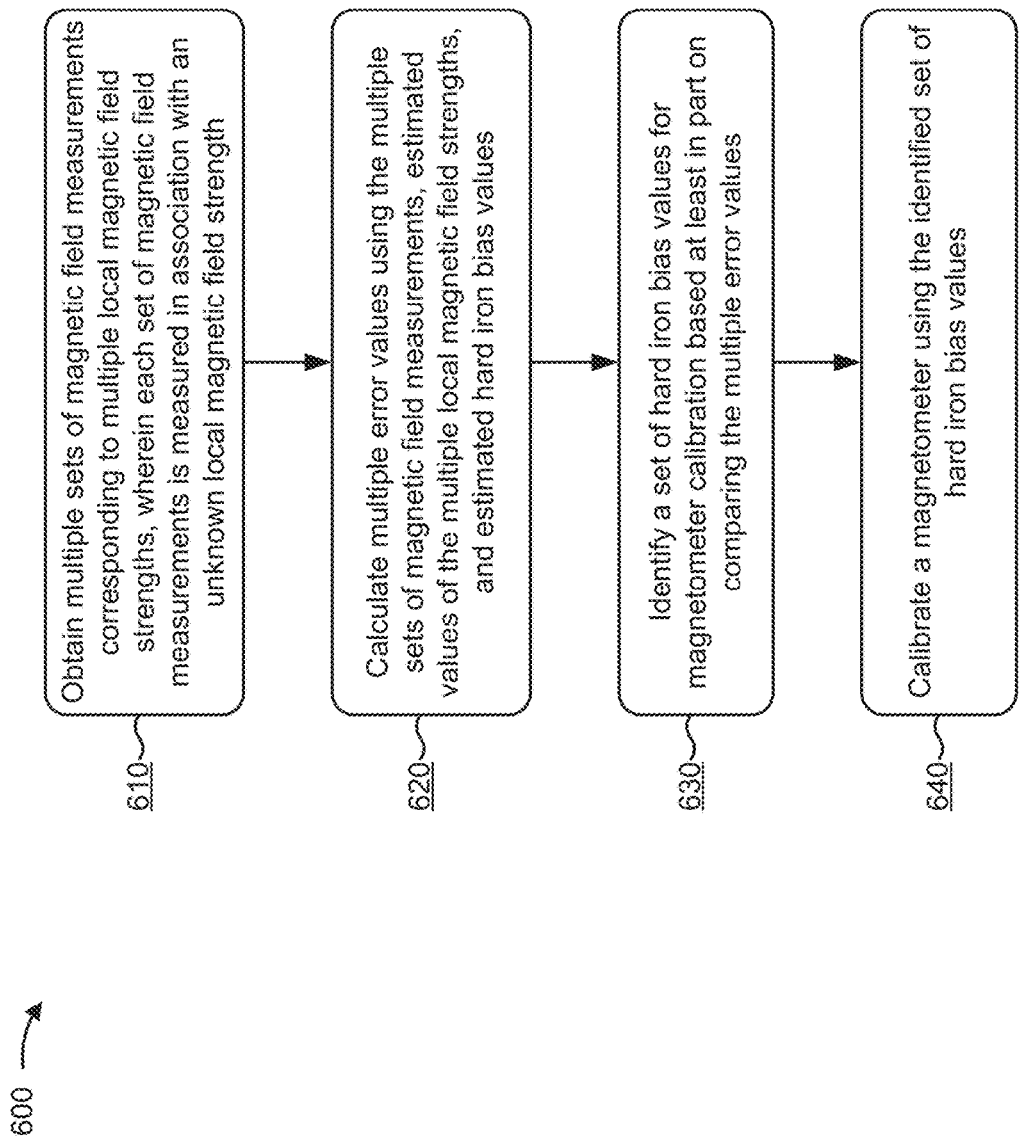
FIG. 6 is a diagram illustrating an example process for magnetometer calibration using selected measurements over time, in accordance with various aspects of the present disclosure.

In some aspects, device 200 includes means for performing one or more processes described herein and/or means for performing one or more operations of the processes described herein, such as process 600 of FIG. 6 and/or one or more other processes described herein (e.g., in FIGS. 3-5). For example, the means for performing the processes and/or operations described herein may include bus 205, processor 210, memory 215, storage component 220, input component 225, output component 230, communication interface 235, magnetometer 240, location sensor 245, gyroscope 250, clock 255, accelerometer 260, speed sensor 265, and/or any combination thereof.

The number and arrangement of components shown in FIG. 2 are provided as an example. In practice, device 200 may include additional components, fewer components, different components, or differently arranged components than those shown in FIG. 2. Additionally, or alternatively, a set of components (e.g., one or more components) of device 200 may perform one or more functions described as being performed by another set of components of device 200.

FIG. 3 is a diagram illustrating an example 300 of magnetometer calibration using selected measurements over time, in accordance with various aspects of the present disclosure.

As shown in FIG. 3, and by reference number 310, mobile device 110 may obtain multiple sets of magnetic field measurements (e.g., using magnetometer 240). A set of magnetic field measurements may be represented by a first magnetic field measurement in a first direction (e.g., shown as $u_{ix}$, where the first direction is the x direction), a second magnetic field measurement in a second direction (e.g., shown as $u_{iy}$, where the second direction is the y direction), and a third magnetic field measurement in a third direction (e.g., shown as $u_{iz}$, where the third direction is the z direction).

A set of magnetic field measurements may correspond to a local magnetic field strength $K_i$ at a time when and a location where the set of magnetic field measurements is obtained. In some aspects, different sets of magnetic field measurements may correspond to different local magnetic field strengths. For example, different sets of magnetic field measurements may be obtained at different locations and/or at different times, and the value of the local magnetic field strength may be different at different locations and/or at different times. The actual values of the local magnetic field strengths $K_i$ associated with the sets of magnetic field measurements may be unknown. Thus, mobile device 110 may estimate the values of $K_i$ to identify a set of hard iron bias values to be used to calibrate magnetometer 240.

For example, as shown by reference number 320, mobile device 110 may calculate multiple error values E using the multiple sets of magnetic field measurements (e.g., $[u_{ix}, u_{iy}, u_{iz}]$), estimated values of the multiple local magnetic field strengths (e.g., $K_i$), and estimated hard iron bias values. The estimated hard iron bias values are shown as $[b_x, b_y, b_z]$, which may represent an estimated hard iron bias in a first direction (e.g., x), an estimated hard iron bias value in a second direction (e.g., y), and an estimated hard iron bias value in a third direction (e.g., z).

As an example, mobile device 110 may calculate an error value E for a particular set of estimated hard iron bias values $[b_x, b_y, b_z]$ according to:

$$E = \sum_i \left( ((u_{ix}-b_x)^2 + (u_{iy}-b_y)^2 + (u_{iz}-b_z)^2)^{\frac{1}{2}} - K_i \right)^2$$

In the above equation, $[b_x, b_y, b_z]$ represents a set of estimated hard iron bias values for which the error value E is being calculated, $[u_{ix}, u_{iy}, u_{iz}]$ represents an $i^{th}$ set of magnetic field measurements, and $K_i$ represents an estimated local magnetic field strength associated with the $i^{th}$ set of magnetic field measurements. In this example, E represents a least squares error associated with the set of estimated hard iron bias values $[b_x, b_y, b_z]$. In some aspects, other techniques for calculating the error value E may be used, such as a mean square error, linear regression, and/or the like.

In some aspects, mobile device 110 may calculate the error value E by constraining one or more values of local magnetic field strengths $K_i$. For example, mobile device 110 may set two or more values of $K_i$ to be equal (e.g., two values of $K_i$ that correspond to two different sets of magnetic field measurements, three values of $K_i$ that correspond to three different sets of magnetic field measurements, all values of $K_i$ that correspond to all sets of magnetic field measurements, etc.). Additionally, or alternatively, mobile device 110 may constrain one or more values of $K_i$ to be within a range of values. In some aspects, the range of values may be an absolute range. Additionally, or alternatively, the range of values for a second value of $K_i$ may depend on a first value of $K_i$ (e.g., associated with a different set of magnetic field measurements).

Additionally, or alternatively, the range of values may depend on, for example, an amount of time that has passed between magnetic field measurements, a distance that the mobile device 110 has moved between magnetic field measurements, a difference in location between magnetic field measurements, and/or the like. For example, mobile device 110 may set the range of values to a smaller range when a shorter amount of time has passed, when the mobile device 110 has moved a shorter distance, and/or when the difference in location is smaller, and may set the range of values to a larger range when a longer amount of time has passed, when the mobile device 110 has moved a longer distance, and/or when the difference in location is larger.

In some aspects, mobile device 110 may constrain the one or more values of $K_i$ when a condition is satisfied, as described in more detail below. In some aspects, the condition may indicate that the values of $K_i$ are likely to be equal or within a threshold range, such as when different sets of magnetic field measurements, corresponding to the values of $K_i$, are obtained within a threshold period of time, are obtained within a short distance of one another, and/or the like. By constraining the values of $K_i$ based at least in part on one or more conditions that indicate that the values of $K_i$ are likely to be equal or within a threshold range, mobile device 110 may improve an accuracy of magnetometer calibration, may be capable of performing magnetometer calibration using fewer sets of magnetic field measurements (thereby conserving computing resources), and/or may improve a user experience by permitting magnetometer calibration without using a movement pattern.

As shown by reference number 330, mobile device 110 may identify a set of hard iron bias values for magnetometer calibration, which may be represented by $[B_x, B_y, B_z]$. For example, mobile device 110 may calculate multiple error values E for multiple sets of estimated hard iron bias values $[b_x, b_y, b_z]$, as described above. Mobile device 110 may identify a particular set of estimated hard iron bias values $[b_x, b_y, b_z]$ as the set of hard iron bias values $[B_x, B_y, B_z]$ to be used for magnetometer calibration. For example, mobile device 110 may select a set of hard iron bias values $[b_x, b_y, b_z]$ associated with the smallest (e.g., minimum) error value E as the set of hard iron bias values $[B_x, B_y, B_z]$ to be used for magnetometer calibration.

As shown by reference number 340, mobile device 110 may calibrate magnetometer 240 using the identified set of hard iron bias values $[B_x, B_y, B_z]$. Additionally, or alternatively, although not shown, mobile device 110 may calibrate magnetometer 240 using a set of estimated soft iron bias values. In some aspects, mobile device 110 may constrain the set of estimated soft iron bias values so that the mean of the set of estimated soft iron bias values (e.g., in the x direction, the y direction, and the z direction) is equal to one. In this way, mobile device 110 may improve the accuracy of magnetometer calibration.

In some aspects, mobile device 110 may determine a measure of confidence associated with the hard iron bias values $[B_x, B_y, B_z]$ used to calibrate magnetometer 240 (e.g., may determine a measure of confidence in the magnetometer calibration). For example, mobile device 110 may determine the measure of confidence using one or more of: the error value E associated with the hard iron bias values $[B_x, B_y, B_z]$, the number i of sets of magnetic field measurements $[u_{ix}, u_{iy}, u_{iz}]$ used in the calibration calculation described in connection with reference number 320, a measure of geometric diversity of the sets of magnetic field measurements $[u_{ix}, u_{iy}, u_{iz}]$ used in the calculation, the age of the sets of magnetic field measurements $[u_{ix}, u_{iy}, u_{iz}]$ used in the calculation, gyroscope data and a degree to which the magnetometer calibration agrees with the gyroscope data, the degree to which the magnetometer calibration agrees with past calculations, a second partial derivative test performed on the calibration function described in connection with reference number 320 (e.g., to determine if the error value E is a local minimum), or some combination thereof.

In some aspects, mobile device 110 may store one or more quality values corresponding to one or more calibration attempts (e.g., for one or more sets of hard iron bias values $[B_x, B_y, B_z]$ used to calibrate magnetometer 240). A quality value may be determined using one or more of: the error value E associated with the hard iron bias values $[B_x, B_y, B_z]$ (e.g., a calculation based on the error value, such as $\sigma=\sqrt{E}$), one or more covariance values for $B_x$, $B_y$, and $B_z$ (e.g., a largest covariance between $B_x$, $B_y$, and $B_z$, as determined by using a covariance matrix or inverse Hessian matrix $H^{-1}$), a degree to which the calibration calculation is over-constrained (e.g., which may be determined based on the number of sets of magnetic field measurements used in the calibration calculation and/or the number of different local magnetic fields estimated in the calibration calculation), or some combination thereof.

In some aspects, mobile device 110 may determine a measure of confidence for a set of hard iron bias values $[B_x, B_y, B_z]$ based at least in part on the quality values determined for the set of hard iron bias values $[B_x, B_y, B_z]$. In some aspects, mobile device 110 may determine a measure of confidence associated with the hard iron bias values $[B_x, B_y, B_z]$ based at least in part on a degree of consistency between multiple calibration attempts (e.g., multiple sets of hard iron bias values $[B_x, B_y, B_z]$ used to calibrate magnetometer 240) and/or the quality values associated with the multiple sets of hard iron bias values $[B_x, B_y, B_z]$. In some aspects, mobile device 110 may output information that identifies the measure of confidence. For example, mobile device 110 may output this information to a display of mobile device 110, may output this information to determine whether to re-calibrate magnetometer 240, and/or the like.

In some aspects, mobile device 110 may detect an event that triggers calibration and/or validation (e.g., to determine whether a current calibration is accurate) of magnetometer 240. For example, mobile device 110 may determine that a degree of confidence and/or a quality value associated with the calibration (e.g., associated with $[B_x, B_y, B_z]$) fails to satisfy a threshold, and may trigger re-calibration. Additionally, or alternatively, mobile device 110 may detect a spike in the strength of a magnetic field (e.g., a rate of increase that satisfies a threshold), and may trigger calibration and/or validation based at least in part on detecting the spike. Additionally, or alternatively, mobile device 110 may detect that mobile device 110 is located in a benign magnetic environment (e.g., as described below in connection with FIG. 5), and may validate a magnetometer calibration based at least in part on this detection. In this way, mobile device 110 may monitor magnetometer 240 to determine whether to re-calibrate magnetometer 240 to achieve accurate magnetic field measurements.

As indicated above, FIG. 3 is provided as an example. Other examples are possible and may differ from what was described above in connection with FIG. 3.

FIG. 4 is a diagram illustrating another example 400 of magnetometer calibration using selected measurements over time, in accordance with various aspects of the present disclosure. FIG. 4 shows an example where mobile device 110 constrains one or more values of $K_i$ when calculating error values E, as described above in connection with reference number 320 of FIG. 3.

As shown by reference number 410, mobile device 110 may determine that a condition associated with multiple sets of magnetic field measurements is satisfied. The condition may be associated with constraining one or more values of Ki (e.g., the estimated local magnetic field strength).

As shown by reference number 420, mobile device 110 may constrain one or more values of $K_i$ when the condition is satisfied. In some aspects, mobile device 110 may constrain two or more values of $K_i$ by setting the two or more values of $K_i$ to be equal. Additionally, or alternatively, mobile device 110 may constrain one or more values of $K_i$ to be within a range of values. Such constraints may be applied when calculating one or more error values E, as described above in connection with reference number 320 of FIG. 3.

As an example, and as shown by reference number 430, the condition may include a time condition. The time condition may indicate that at least two sets of magnetic field measurements are to be measured within a threshold time of one another. For example, if two sets of magnetic field measurements $[u_{ix}, u_{iy}, u_{iz}]$ are measured within a threshold time of one another, then mobile device 110 may constrain the estimated values of the two local magnetic field strengths $K_i$ corresponding to the two sets of magnetic field measurements (e.g., by setting the values of $K_i$ to be equal or within a threshold difference of one another). In this case, mobile device 110 may constrain the values of $K_i$ because magnetic field measurements obtained within a threshold time of one another may have a high likelihood of being obtained in a similar magnetic field.

While described in the context of two sets of magnetic field measurements corresponding to two local magnetic field strengths, mobile device 110 may apply a similar technique to three sets of magnetic field measurements obtained within a threshold time of one another (e.g., the first and second sets obtained within a threshold time, the second and third sets obtained within a threshold time, and/or the first, second, and third sets obtained within a threshold time), four sets of magnetic field measurements obtained within a threshold time of one another, and/or the like.

Additionally, or alternatively, as shown by reference number 440, the condition may include a distance condition. The distance condition may indicate that at least two sets of magnetic field measurements are to be measured within a threshold distance of one another. For example, if two sets of magnetic field measurements [$u_{ix}$, $u_{iy}$, $u_{iz}$] are measured within a threshold distance of one another, then mobile device 110 may constrain the estimated values of the two local magnetic field strengths $K_i$ corresponding to the two sets of magnetic field measurements (e.g., by setting the values of $K_i$ to be equal or within a threshold difference of one another). In this case, mobile device 110 may constrain the values of $K_i$ because magnetic field measurements obtained within a threshold distance of one another may have a high likelihood of being obtained in a similar magnetic field. In some aspects, mobile device 110 may determine distances corresponding to different sets of magnetic field measurements using location data (e.g., obtained from location monitoring device 130 and/or location sensor 245).

While described in the context of two sets of magnetic field measurements corresponding to two local magnetic field strengths, mobile device 110 may apply a similar technique to three sets of magnetic field measurements obtained within a threshold distance of one another (e.g., the first and second sets obtained within a threshold distance, the second and third sets obtained within a threshold distance, and/or the first, second, and third sets obtained within a threshold distance), four sets of magnetic field measurements obtained within a threshold distance of one another, etc.

By constraining estimated values of $K_i$ when calculating error values E, mobile device 110 may increase an accuracy of magnetometer calibration without requiring a user to move mobile device 110 in a precise pattern, thereby improving a user experience.

As indicated above, FIG. 4 is provided as an example. Other examples are possible and may differ from what was described above in connection with FIG. 4.

FIG. 5 is a diagram illustrating another example 500 of magnetometer calibration using selected measurements over time, in accordance with various aspects of the present disclosure. FIG. 5 shows an example where mobile device 110 includes, excludes, or assigns a weight to one or more sets of magnetic field measurements [$u_{ix}$, $u_{iy}$, $u_{iz}$] when calculating error values E, as described above in connection with reference number 320 of FIG. 3.

As shown by reference number 510, mobile device 110 may determine that a condition for including, excluding, or assigning a weight to one or more sets of magnetic field measurements is satisfied. The condition may be used to determine whether to include a set of magnetic field measurements in the calculation of an error value E, whether to exclude a set of magnetic field measurements in the calculation of an error value E, and/or whether to assign a weight to a set of magnetic field measurements in the calculation of an error value E (e.g., a higher weight than a weight assigned to another set of magnetic field measurements, a lower weight than a weight assigned to another set of magnetic field measurements, or a same weight as a weight assigned to another set of magnetic field measurements).

As shown by reference number 520, mobile device 110 may include, exclude, or assign a weight to one or more sets of magnetic field measurements when the condition is satisfied. As an example, mobile device 110 may assign a weight $w_i$ to a set of magnetic field measurements [$u_{ix}$, $u_{iy}$, $u_{iz}$] as follows:

$$E = \sum_i w_i \times \left( ((u_{ix} - b_x)^2 + (u_{iy} - b_y)^2 + (u_{iz} - b_z)^2)^{\frac{1}{2}} - K_i \right)^2$$

In the above equation, $w_i$ may have different values for different sets of magnetic field measurements [$u_{ix}$, $u_{iy}$, $u_{iz}$] depending on one or more conditions associated with different sets of magnetic field measurements (e.g., a condition when a set of magnetic field measurements is obtained). In some aspects, $w_i$ may have the same values for different sets of magnetic field measurements. In some aspects, mobile device 110 may set the value of $w_i$ to be higher to increase a weight applied to a set of magnetic field measurements, or may set the value of $w_i$ to be lower to decrease a weight applied to a set of magnetic field measurements. In some aspects, mobile device 110 may set the value of $w_i$ to zero to exclude a set of magnetic field measurements [$u_{ix}$, $u_{iy}$, $u_{iz}$] from the calculation.

As an example, and as shown by reference number 530, the condition may include a geometric diversity condition. The geometric diversity condition may be associated with one or more magnetometer orientations when one or more sets of magnetic field measurements are measured. For example, the geometric diversity condition may require that two or more sets of magnetic field measurements (e.g., at least two sets) are measured at a threshold quantity of magnetometer orientations. When the sets of magnetic field measurements used to calculate the error value are obtained at a larger number of magnetometer orientations, then magnetometer calibration may be more accurate than if the sets of magnetic field measurements were obtained at a smaller number of magnetometer orientations. Furthermore, when the sets of magnetic field measurements are obtained with more geometric diversity (e.g., at more magnetometer orientations), then fewer sets of magnetic field measurements may be used with a similar or greater degree of accuracy than a higher number of sets of magnetic field measurements with a lower geometric diversity. Thus, by using geometrically diverse sets of magnetic field measurements, mobile device 110 may conserve computing resources (e.g., by using fewer sets of magnetic field measurements, thereby requiring fewer processing resources, memory resources, etc.).

In some aspects, mobile device 110 may exclude and/or assign a lower weight to a set of magnetic field measurements for a calculation if a threshold quantity of sets (e.g., one set, two sets, etc.) of magnetic field measurements with the same or similar (e.g., within a threshold tolerance) magnetometer orientation have already been included in the calculation. Additionally, or alternatively, mobile device 110 may include and/or assign a higher weight to a set of magnetic field measurements in a calculation if no other sets of magnetic field measurements with the same or similar magnetometer orientation are included in the calculation. Additionally, or alternatively, mobile device 110 may assign a higher weight to a first set of magnetic field measurements obtained at a magnetometer orientation, and may assign a lower weight to a second set of magnetic field measurements obtained at the same or a similar magnetometer orientation Additionally, or alternatively, as shown by reference number 540, the condition may include a magnetic field strength condition. The magnetic field strength condition may be associated with an estimated local magnetic field strength when one or more sets of magnetic field measurements are measured. For example, the magnetic field strength condition may require that one or more sets of magnetic field measurements are measured when an estimated local magnetic field strength (e.g., as indicated by the values of the magnetic field measurements) is less than (or less than or equal to) a threshold strength. When a set of magnetic field measurements are obtained when the local magnetic field strength is large (e.g., greater than (or greater than or equal to) a threshold), then the set of magnetic field measurements are more likely to have been obtained in a non-zero field gradient, which may lead to a less accurate estimation of $K_i$ for that set of magnetic field measurements.

In some aspects, mobile device 110 may exclude or assign a lower weight to a set of magnetic field measurements [$u_{ix}$, $u_{iy}$, $u_{iz}$] obtained when an estimated value of $K_i$ is greater than (or greater than or equal to) a first threshold. Additionally, or alternatively, mobile device 110 may include or assign a higher weight to a set of magnetic field measurements [$u_{ix}$, $u_{iy}$, $u_{iz}$] obtained when an estimated value of $K_i$ is less than (or less than or equal to) a second threshold. In some aspects, the first threshold and the second threshold may be the same value. In some aspects, the first threshold and the second threshold may be different values. In this way, mobile device 110 may increase a likelihood of accurate estimation of $K_i$, thereby increasing an accuracy of magnetometer calibration while potentially using fewer sets of magnetic field measurements, thereby conserving computing resources of mobile device 110.

Additionally, or alternatively, as shown by reference number 550, the condition may include a speed condition. The speed condition may be associated with a speed of mobile device 110 when one or more sets of magnetic field measurements are measured. For example, the speed condition may require that one or more sets of magnetic field measurements are measured when a speed of mobile device 110 (e.g., as indicated by accelerometer 260 and/or speed sensor 265) is less than (or less than or equal to) a threshold speed. When a set of magnetic field measurements are obtained when mobile device 110 is moving at a high speed (e.g., greater than (or greater than or equal to) a threshold), then the set of magnetic field measurements are more likely to have been obtained when the value of $K_i$ is more difficult to estimate (e.g., due to a magnetic field that changes through space).

In some aspects, mobile device 110 may exclude or assign a lower weight to a set of magnetic field measurements [$u_{ix}$, $u_{iy}$, $u_{iz}$] obtained when the speed of mobile device 110 is greater than (or greater than or equal to) a first threshold. Additionally, or alternatively, mobile device 110 may include or assign a higher weight to a set of magnetic field measurements [$u_{ix}$, $u_{iy}$, $u_{iz}$] obtained when the speed of mobile device 110 is less than (or less than or equal to) a second threshold. In some aspects, the first threshold and the second threshold may be the same value. In some aspects, the first threshold and the second threshold may be different values. In this way, mobile device 110 may increase a likelihood of accurate estimation of $K_i$, thereby increasing an accuracy of magnetometer calibration while potentially using fewer sets of magnetic field measurements, thereby conserving computing resources of mobile device 110.

Additionally, or alternatively, as shown by reference number 560, the condition may include a magnetic environment condition. The magnetic environment condition may be associated with a state of a magnetic environment in which one or more sets of magnetic field measurements are measured. For example, the magnetic environment condition may require that one or more sets of magnetic field measurements are measured when location data (e.g., GPS data, triangulation data, etc.) indicates that mobile device 110 is located in a benign magnetic environment, such as outdoors. When a set of magnetic field measurements are obtained when mobile device 110 is not in a benign magnetic environment (e.g., is indoors), then the set of magnetic field measurements are more likely to have been obtained when the value of $K_i$ is more difficult to estimate (e.g., due to magnetic materials and distortions that occur indoors).

In some aspects, mobile device 110 may exclude or assign a lower weight to a set of magnetic field measurements [$u_{ix}$, $u_{iy}$, $u_{iz}$] obtained when mobile device 110 is not located in a benign magnetic environment. Additionally, or alternatively, mobile device 110 may include or assign a higher weight to a set of magnetic field measurements [$u_{ix}$, $u_{iy}$, $u_{iz}$] obtained when mobile device 110 is located in a benign magnetic environment. In this way, mobile device 110 may increase a likelihood of accurate estimation of $K_i$, thereby increasing an accuracy of magnetometer calibration while potentially using fewer sets of magnetic field measurements, thereby conserving computing resources of mobile device 110.

Additionally, or alternatively, mobile device 110 may include or assign a higher weight to a set of magnetic field measurements that is consistent with (e.g., within a threshold tolerance of) a magnetic field model, such as an International Geomagnetic Reference Field (IGRF) model. Additionally, or alternatively, mobile device 110 may exclude or assign a lower weight to a set of magnetic field measurements that is not consistent with (e.g., is outside a threshold tolerance of) a magnetic field model, such as an IGRF model.

As indicated above, FIG. 5 is provided as an example. Other examples are possible and may differ from what was described above in connection with FIG. 5.

FIG. 6 is a diagram illustrating an example process 600 for magnetometer calibration using selected measurements over time, in accordance with various aspects of the present disclosure. In some aspects, one or more process blocks of FIG. 6 may be performed by mobile device 110.

As shown in FIG. 6, in some aspects, process 600 may include obtaining multiple sets of magnetic field measurements corresponding to multiple local magnetic field strengths, wherein each set of magnetic field measurements is measured in association with an unknown local magnetic field strength (block 610). For example, mobile device 110 may obtain multiple sets of magnetic field measurements [$u_{ix}$, $u_{iy}$, $u_{iz}$]. The multiple sets of magnetic field measurements may correspond to multiple local magnetic field strengths $K_i$ (e.g., each set of multiple magnetic field measurements may correspond to a local magnetic field strength). In some aspects, the multiple sets of magnetic field measurements may be measured in association with an unknown local magnetic field strength. For example, the local magnetic field strength may be unknown at a location and/or a time at which a set of magnetic field measurements is measured. Additional details regarding obtaining the sets of magnetic field measurements are provided above in connection with FIGS. 3-5.

As shown in FIG. 6, in some aspects, process 600 may include calculating multiple error values using the multiple sets of magnetic field measurements, estimated values of the multiple local magnetic field strengths, and estimated hard iron bias values (block 620). For example, mobile device 110 may calculate multiple error values E using the multiple sets of magnetic field measurements [$u_{ix}$, $u_{iy}$, $u_{iz}$], estimated values of the multiple local magnetic field strengths $K_i$, and estimated hard iron bias values [$b_x$, $b_y$, $b_z$].

In some aspects, mobile device 110 may determine that a condition associated with the multiple sets of magnetic field measurements is satisfied. In some aspects, the condition may require that at least two of the multiple sets of magnetic field measurements are measured within a threshold time of one another. Additionally, or alternatively, the condition may require that at least two of the multiple sets of magnetic field measurements are measured within a threshold distance of one another. In some aspects, mobile device 110 may constrain one or more values of the multiple local magnetic field strengths based at least in part on determining that the condition is satisfied, and may calculate the multiple error values based at least in part on constraining the one or more values of the multiple local magnetic field strengths. In some aspects, mobile device 110 may constrain the one or more values by setting at least two of the one or more values to be equal. Additionally, or alternatively, mobile device 110 may constraint the one or more values by constraining the one or more values to be within a range of values.

In some aspects, the multiple local magnetic field strengths may be associated with different locations (e.g., the multiple sets of magnetic field measurements may be measured at different locations). Additionally, or alternatively, the multiple local magnetic field strengths may be associated with different times (e.g., the multiple sets of magnetic field measurements may be measured at different times).

In some aspects, mobile device 110 may determine that a condition for including, excluding, or assigning a weight to one or more sets of magnetic field measurements, in association with calculating one or more error values, is satisfied. In some aspects, the condition may include a geometric diversity condition associated with one or more magnetometer orientations when the one or more sets of magnetic field measurements are measured. Additionally, or alternatively, the condition may include a magnetic field strength condition associated with an estimated local magnetic field strength when the one or more sets of magnetic field measurements are measured. Additionally, or alternatively, the condition may include a speed condition associated with a speed of the device when the one or more sets of magnetic field measurements are measured. Additionally, or alternatively, the condition may include a magnetic environment condition associated with a state of a magnetic environment in which the one or more sets of magnetic field measurements are measured. Mobile device 110 may include, exclude, or assign the weight to the one or more sets of magnetic field measurements based at least in part on determining that the condition is satisfied, and may calculate the multiple error values based at least in part on including, excluding, or assigning the weight to the one or more sets of magnetic field measurements.

As shown in FIG. 6, in some aspects, process 600 may include identifying a set of hard iron bias values for magnetometer calibration based at least in part on comparing the multiple error values (block 630). For example, mobile device 110 may identify a set of hard iron bias values to be used for magnetometer calibration based at least in part on comparing the multiple error values, as described above in connection with FIGS. 3-5.

As shown in FIG. 6, in some aspects, process 600 may include calibrating a magnetometer using the identified set of hard iron bias values (block 640). For example, mobile device 110 may calibrate magnetometer 240 using the identified set of hard iron bias values, as described above in connection with FIGS. 3-5. In some aspects, mobile device 110 may determine a measure of confidence associated with the identified set of hard iron bias values, and may output information that identifies the measure of confidence. In some aspects, mobile device 110 may estimate a set of soft iron bias values for magnetometer 240, and may calibrate magnetometer 240 based at least in part on estimating the set of soft iron bias values and identifying the set of hard iron bias values.

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

Aspects described herein improve the accuracy of magnetometer calibration. Furthermore, aspects described herein permit magnetometer calibration using the natural movement of a mobile device (e.g., in association with movement by a user), thereby improving a user experience and an accuracy of the calibration. Furthermore, aspects described herein may conserve computing resources due to efficient selection of parameters for magnetometer calibration.

The foregoing disclosure provides illustration and description, but is not intended to be exhaustive or to limit the aspects to the precise form disclosed. Modifications and variations are possible in light of the above disclosure or may be acquired from practice of the aspects.

As used herein, the term component is intended to be broadly construed as hardware, firmware, or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, or the like.

It will be apparent that systems and/or methods, described herein, may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible aspects. In fact, many of these features may be combined in ways not specifically recited in the claims and/or disclosed in the specification. Although each dependent claim listed below may directly depend on only one claim, the disclosure of possible aspects includes each dependent claim in combination with every other claim in the claim set. A phrase referring to "at least one of" a list of items refers to any combination of those items, including single members. As an example, "at least one of: a, b, or c" is intended to cover: a; b; c; a and b; a and c; b and c; and a, b and c.

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method of magnetometer calibration, comprising:
obtaining, by a device, multiple sets of magnetic field measurements corresponding to multiple local magnetic field strengths, wherein each set of magnetic field measurements is measured in association with an unknown local magnetic field strength;
calculating, by the device, multiple error values using the multiple sets of magnetic field measurements, estimated values of the multiple local magnetic field strengths, and multiple sets of estimated hard iron bias values,
wherein each error value, of the multiple error values, is calculated using the multiple sets of magnetic field measurements, the estimated values of the multiple local magnetic field strengths, and a respective set of estimated hard iron bias values, of the multiple sets of estimated hard iron bias values;
identifying, by the device, a set of hard iron bias values, from among the multiple sets of estimated hard iron bias values, for magnetometer calibration based at least in part on comparing the multiple error values; and
calibrating, by the device, a magnetometer using the identified set of hard iron bias values.

2. The method of claim 1, further comprising:
determining that a condition associated with the multiple sets of magnetic field measurements is satisfied;
constraining one or more values of the multiple local magnetic field strengths based at least in part on determining that the condition is satisfied; and
calculating the multiple error values based at least in part on constraining the one or more values of the multiple local magnetic field strengths.

3. The method of claim 2, wherein the condition includes at least one of:
a time condition that requires that at least two of the multiple sets of magnetic field measurements are measured within a threshold time of one another,
a distance condition that requires that at least two of the multiple sets of magnetic field measurements are measured within a threshold distance of one another, or
some combination thereof.

4. The method of claim 2, wherein constraining the one or more values of the multiple local magnetic field strengths comprises at least one of:
setting at least two of the one or more values to be equal, or
constraining the one or more values to be within a range of values.

5. The method of claim 1, wherein the multiple local magnetic field strengths are associated with different locations and/or different times.

6. The method of claim 1, further comprising:
determining a measure of confidence associated with the identified set of hard iron bias values; and
outputting information that identifies the measure of confidence.

7. The method of claim 1, further comprising:
determining that a condition for including, excluding, or assigning a weight to one or more sets of magnetic field measurements is satisfied;
including, excluding, or assigning the weight to the one or more sets of magnetic field measurements based at least in part on determining that the condition is satisfied; and
calculating the multiple error values based at least in part on including, excluding, or assigning the weight to the one or more sets of magnetic field measurements.

8. The method of claim 7, wherein the condition includes at least one of:
a geometric diversity condition associated with one or more magnetometer orientations when the one or more sets of magnetic field measurements are measured,
a magnetic field strength condition associated with an estimated local magnetic field strength when the one or more sets of magnetic field measurements are measured,
a speed condition associated with a speed of the device when the one or more sets of magnetic field measurements are measured,
a magnetic environment condition associated with a state of a magnetic environment in which the one or more sets of magnetic field measurements are measured, or
some combination thereof.

9. The method of claim 1, further comprising:
estimating a set of soft iron bias values for the magnetometer; and
calibrating the magnetometer based at least in part on estimating the set of soft iron bias values and identifying the set of hard iron bias values.

10. A device, comprising:
one or more processors to:
obtain multiple sets of magnetic field measurements corresponding to multiple local magnetic field strengths, wherein each set of magnetic field measurements is measured in association with an unknown local magnetic field strength;
calculate multiple error values using the multiple sets of magnetic field measurements, estimated values of the multiple local magnetic field strengths, and multiple sets of estimated hard iron bias values,
wherein each error value, of the multiple error values, is calculated using the multiple sets of magnetic field measurements, the estimated values of the multiple local magnetic field strengths, and a respective set of estimated hard iron bias values, of the multiple sets of estimated hard iron bias values;
identify a set of hard iron bias values, from among the multiple sets of estimated hard iron bias values, for magnetometer calibration based at least in part on comparing the multiple error values; and
calibrate a magnetometer using the identified set of hard iron bias values.

11. The device of claim 10, wherein the one or more processors are further to:
determine that a condition associated with the multiple sets of magnetic field measurements is satisfied;
constrain one or more values of the multiple local magnetic field strengths based at least in part on determining that the condition is satisfied; and
calculate the multiple error values based at least in part on constraining the one or more values of the multiple local magnetic field strengths.

12. The device of claim 11, wherein the condition includes at least one of:
a time condition that requires that at least two of the multiple sets of magnetic field measurements are measured within a threshold time of one another,
a distance condition that requires that at least two of the multiple sets of magnetic field measurements are measured within a threshold distance of one another, or
some combination thereof.

13. The device of claim 11, wherein the one or more processors, when constraining the one or more values of the multiple local magnetic field strengths, are to at least one of:
set at least two of the one or more values to be equal, or
constrain the one or more values to be within a range of values.

14. The device of claim 10, wherein the multiple local magnetic field strengths are associated with different locations and/or different times.

15. The device of claim 10, wherein the one or more processors are further to:
determine a measure of confidence associated with the identified set of hard iron bias values; and
output information that identifies the measure of confidence.

16. The device of claim 10, wherein the one or more processors are further to:
determine that a condition for including, excluding, or assigning a weight to one or more sets of magnetic field measurements is satisfied;
include, exclude, or assign the weight to the one or more sets of magnetic field measurements based at least in part on determining that the condition is satisfied; and
calculate the multiple error values based at least in part on including, excluding, or assigning the weight to the one or more sets of magnetic field measurements.

17. The device of claim 16, wherein the condition includes at least one of:
a geometric diversity condition associated with one or more magnetometer orientations when the one or more sets of magnetic field measurements are measured,
a magnetic field strength condition associated with an estimated local magnetic field strength when the one or more sets of magnetic field measurements are measured,
a speed condition associated with a speed of the device when the one or more sets of magnetic field measurements are measured,
a magnetic environment condition associated with a state of a magnetic environment in which the one or more sets of magnetic field measurements are measured, or
some combination thereof.

18. The device of claim 10, wherein the one or more processors are further to:
estimate a set of soft iron bias values for the magnetometer; and
calibrate the magnetometer based at least in part on estimating the set of soft iron bias values and identifying the set of hard iron bias values.

19. A non-transitory computer-readable medium storing instructions, the instructions comprising:
one or more instructions that, when executed by one or more processors of a device, cause the one or more processors to:
obtain multiple sets of magnetic field measurements corresponding to multiple local magnetic field strengths, wherein each set of magnetic field measurements is measured in association with an unknown local magnetic field strength;
calculate multiple error values using the multiple sets of magnetic field measurements, estimated values of the multiple local magnetic field strengths, and multiple sets of estimated hard iron bias values,
wherein each error value, of the multiple error values, is calculated using the multiple sets of magnetic field measurements, the estimated values of the multiple local magnetic field strengths, and a respective set of estimated hard iron bias values, of the multiple sets of estimated hard iron bias values;
identify a set of hard iron bias values, from among the multiple sets of estimated hard iron bias values, for magnetometer calibration based at least in part on comparing the multiple error values; and
calibrate a magnetometer using the identified set of hard iron bias values.

20. The non-transitory computer-readable medium of claim 19, wherein the one or more instructions, when executed by the one or more processors, further cause the one or more processors to:
determine that a condition associated with the multiple sets of magnetic field measurements is satisfied;
constrain one or more values of the multiple local magnetic field strengths based at least in part on determining that the condition is satisfied; and
calculate the multiple error values based at least in part on constraining the one or more values of the multiple local magnetic field strengths.

21. The non-transitory computer-readable medium of claim 20, wherein the condition includes at least one of:
a time condition that requires that at least two of the multiple sets of magnetic field measurements are measured within a threshold time of one another,
a distance condition that requires that at least two of the multiple sets of magnetic field measurements are measured within a threshold distance of one another, or
some combination thereof.

22. The non-transitory computer-readable medium of claim 19, wherein the multiple local magnetic field strengths are associated with at least one of:
different locations,
different times, or
some combination thereof.

23. The non-transitory computer-readable medium of claim 19, wherein the one or more instructions, when executed by the one or more processors, further cause the one or more processors to:
determine that a condition for including, excluding, or assigning a weight to one or more sets of magnetic field measurements is satisfied;
include, exclude, or assign the weight to the one or more sets of magnetic field measurements based at least in part on determining that the condition is satisfied; and
calculate the multiple error values based at least in part on including, excluding, or assigning the weight to the one or more sets of magnetic field measurements.

24. The non-transitory computer-readable medium of claim 23, wherein the condition includes at least one of:
a geometric diversity condition associated with one or more magnetometer orientations when the one or more sets of magnetic field measurements are measured,
a magnetic field strength condition associated with an estimated local magnetic field strength when the one or more sets of magnetic field measurements are measured,
a speed condition associated with a speed of the device when the one or more sets of magnetic field measurements are measured,
a magnetic environment condition associated with a state of a magnetic environment in which the one or more sets of magnetic field measurements are measured, or
some combination thereof.

25. An apparatus, comprising:
- means for obtaining multiple sets of magnetic field measurements corresponding to multiple local magnetic field strengths, wherein each set of magnetic field measurements is measured in association with an unknown local magnetic field strength;
- means for calculating multiple error values using the multiple sets of magnetic field measurements, estimated values of the multiple local magnetic field strengths, and multiple sets of estimated hard iron bias values,
  - wherein each error value, of the multiple error values, is calculated using the multiple sets of magnetic field measurements, the estimated values of the multiple local magnetic field strengths, and a respective set of estimated hard iron bias values, of the multiple sets of estimated hard iron bias values;
- means for identifying a set of hard iron bias values, from among the multiple sets of estimated hard iron bias values, for magnetometer calibration based at least in part on comparing the multiple error values; and
- means for calibrating a magnetometer using the identified set of hard iron bias values.

26. The apparatus of claim 25, further comprising:
- means for determining that a condition associated with the multiple sets of magnetic field measurements is satisfied;
- means for constraining one or more values of the multiple local magnetic field strengths based at least in part on determining that the condition is satisfied; and
- means for calculating the multiple error values based at least in part on constraining the one or more values of the multiple local magnetic field strengths.

27. The apparatus of claim 26, wherein the condition includes at least one of:
- a time condition that requires that at least two of the multiple sets of magnetic field measurements are measured within a threshold time of one another,
- a distance condition that requires that at least two of the multiple sets of magnetic field measurements are measured within a threshold distance of one another, or
- some combination thereof.

28. The apparatus of claim 25, wherein the multiple local magnetic field strengths are associated with at least one of:
- different locations,
- different times, or
- some combination thereof.

29. The apparatus of claim 25, further comprising:
- means for determining that a condition for including, excluding, or assigning a weight to one or more sets of magnetic field measurements is satisfied;
- means for including, excluding, or assigning the weight to the one or more sets of magnetic field measurements based at least in part on determining that the condition is satisfied; and
- means for calculating the multiple error values based at least in part on including, excluding, or assigning the weight to the one or more sets of magnetic field measurements.

30. The apparatus of claim 29, wherein the condition includes at least one of:
- a geometric diversity condition associated with one or more magnetometer orientations when the one or more sets of magnetic field measurements are measured,
- a magnetic field strength condition associated with an estimated local magnetic field strength when the one or more sets of magnetic field measurements are measured,
- a speed condition associated with a speed of the apparatus when the one or more sets of magnetic field measurements are measured,
- a magnetic environment condition associated with a state of a magnetic environment in which the one or more sets of magnetic field measurements are measured, or
- some combination thereof.

* * * * *